United States Patent [19]

Nakayama et al.

[11] Patent Number: 5,112,025

[45] Date of Patent: May 12, 1992

[54] MOLDS HAVING WEAR RESISTANT RELEASE COATINGS

[75] Inventors: Masatoshi Nakayama; Kunihiro Ueda, both of Saku; Toshihiko Ishida, Komoro; Hiroshi Tanabe, Saku, all of Japan

[73] Assignee: TDK Corporation, Tokyo, Japan

[21] Appl. No.: 483,242

[22] Filed: Feb. 22, 1990

[51] Int. Cl.$^5$ .............................................. B29C 33/56
[52] U.S. Cl. ................................ 249/115; 249/114.1; 249/141; 264/338; 425/810; 425/812; 427/135
[58] Field of Search ............... 425/546, 567, 810, 812; 249/114.1, 115, 134, 135, 141; 427/135; 264/338

[56] References Cited

U.S. PATENT DOCUMENTS

| | | | |
|---|---|---|---|
| 4,482,511 | 11/1984 | Komatsubara | 425/810 |
| 4,753,414 | 6/1988 | McCandless | 264/338 |
| 4,783,041 | 11/1988 | Sakaida et al. | 264/338 |
| 4,882,827 | 11/1989 | Kusumi et al. | 65/374.13 |
| 4,948,627 | 8/1990 | Hata et al. | 427/38 |

FOREIGN PATENT DOCUMENTS

| | | |
|---|---|---|
| 57-124046 | 7/1982 | Japan . |
| 57-130203 | 8/1982 | Japan . |
| 58-222114 | 12/1983 | Japan . |
| 59-174507 | 10/1984 | Japan . |
| 59-174508 | 10/1984 | Japan . |
| 59-209834 | 11/1984 | Japan . |
| 59-218821 | 12/1984 | Japan . |
| 60-173734 | 9/1985 | Japan . |
| 61-272362 | 12/1986 | Japan . |
| 1-234397 | 9/1989 | Japan . |

OTHER PUBLICATIONS

Enke, "Hard carbon layers for wear protection and antireflection purposes of infrared devices", Applied Optics, 24(4), p. 508 (1985).
Yamamoto (Japanese Publication) "Properties of Carbonous Films Synthesized by RF Plasma CVD" (1989).
Nakayama et al., "Bias Effect on the Formation of Carbon Films by RF-Plasma CVD", J. Ceramic Soc.
Moravec et al., "Electron spectroscopy of ion beam and hydrocarbon plasma generated diamondlike carbon films", J. Vac. Sci. Technol., 18(2), Mar. 1981, pp. 226–228.
Moravec et al., "The development of diamond-like (i-carbon) thin films as anti-reflecting coatings for silicon solar cells", J. Vac. Sci. Technol., 20(3), Mar. 1982, pp. 338–340.

Primary Examiner—James C. Housel
Attorney, Agent, or Firm—Fish & Richardson

[57] ABSTRACT

A mold including a cavity the inner surface of which is at least partly coated with a layer selected from a diamond-like film and layers of fluorine and fluorine compounds. The mold is manufactured by a method which comprises placing at least a part of the mold which constitutes the surface portion of the mold cavity in a vacuum film-forming chamber, introducing a hydrocarbon gas into the chamber, ionizing the gas, and then evaporating it onto a desired surface portion of the mold, thus forming a diamond-like film over the mold portion. The mold portion is surface-treated by ionizing a low-molecular-weight fluorine compound into a plasma, forming a fluorine polymer film from the plasma on at least a part of the cavity surface, while applying a bias voltage to the plasma.

6 Claims, 3 Drawing Sheets

MOLDS HAVING WEAR RESISTANT RELEASE COATINGS

BACKGROUND OF THE INVENTION

This invention relates to molds, and more specifically to molds for producing such molded articles as phonograph records, compact disks, photomagnetic disks, photo disks, and laser disks. The invention can provide molds of outstandingly long service life. The term "molds" as used herein also encompasses stampers that serve as negatives for the above-mentioned disks.

Recorded media, including phonograph records and audio-visual disks, are made by charging plastic material into the cavity of a mold supporting a stamper (negative) therein, and applying a pressure so as to mold the charge into a desired medium shape while, at the same time, reproducing the surface pattern of the stamper as a reverse impression on the molded surface. A typical example of such a mold is illustrated in FIG. 1. An injection mold for producing laser disks or the like, it comprises a movable mold half 2 and a fixed mold half 5, in such a relation that when the movable mold half is in its closing position a mold cavity 7 is formed. The surface 8 of the movable mold half 2 to face the cavity 7 is mirror polished and supports a metal stamper 1 in the form of a nickel-plated sheet metal. The stamper is securely held in place along the periphery by an outer ring member 4. This member 4 also constitutes the surrounding wall of the cavity. FIG. 1 shows the mold closed, defining the cavity 7 inside. Resin under a given molding pressure is fed through a feed nozzle 3 and the gate 6 of a gate member 12 into the cavity 7, where it is molded to a desired shape. The movable mold half 2 used is made of steel, quenched and hard plated on the surface 8, with a high-precision polish. Thus the mold half is polished smooth enough to permit the stamper to slide over the mold surface 8 upon its contraction or expansion with heat. For example, when the molten resin temperature is 360° C., the temperature of the movable mold half surface 8 is 100° C., and the resin pressure is 400 kg/cm$^2$, the stamper 1 is heated to 360° C. on the side contacting the melt and to 100° C. on the back side, under a pressure equivalent to the resin pressure. Under these conditions, the stamper is caused to move along the surface 8 by the heat and pressure. Repetition of the injection molding cycle with such a mold gradually injures the stamper 1, shot after shot, with the friction involved. The stamper eventually crazes and transfers the craze marks onto the surface of the molded object. The present inventors have observed the development of such defects on the stamper side facing the mounting surface of the mold. The stamper is disk-shaped and restrained at the center so that a certain degree of turning is allowed. Consequently, the localized motion of the stamper due to expansion and shrinkage during molding is the resultant of two motions, radial and rotational, and the more distant from the center the greater. The size of crazes actually measured along the outer periphery of such a stamper was up to about 0.1 mm wide (in the radial direction) and about 1 mm long (in the turning direction). The crazes grew deep with the repeated use of the stamper.

This problem is alleviated to some extent by coating the surface 8 on the cavity side of the stamper with a hard-wearing film of TiN or the like. Adequate wear resistance and low frictional properties are not attained, however.

Another problem associated with the mold of the character is the wear of the gate cut portion. A disk or other molded part, after the solidification of the resin, is formed with a center hole by the shearing action of the edge of a gate cut portion 10 of a gate cut member 9 moved rightward as viewed in FIG. 1, in cooperation with the edge of the hole of the fixed mold half 5. The consequent friction gradually wears down the gate cut portion 10 and the matching portion of the fixed mold half, making the edges dull and eventually chipping them off.

Yet another problem that the mold poses is the corrosion of the air vent. Usually, to facilitate the injection of resin into the mold cavity, an air vent 11 is provided as a gap of about 10 to 20 microns between the fixed mold half 5 and the outer ring member 4. As resin is injected rapidly at elevated pressure, entrapped air is forced out through the air vent 11, while corroding the surrounding wall surface of the passageway. The corrosion is attributed to the attacks by the monomers that resulted from the decomposition of the resin, by the moisture content in the hot air, and by the air escaping at high speed.

A wear problem is further presented by the inner surface of the mold cavity on which molten resin at elevated temperature and pressure usually solidifies and shrinks.

Among the important requirements the stamper and other mold parts must meet are good mold releasability with respect to the molded resin and high surface hardness. In the case of a photo disk, for example, the disk surface is formed with minute irregularities about 0.1 μm high. Only a slight residue of resin left on the stamper surface could mar the stamping function, reduce the accuracy of reproduction, and shorten the life of the stamper.

In order to overcome these problems a number of methods have been proposed to coat the stamper and other mold parts with a hard, highly mold-releasing film. The countermeasures are roughly classified into two categories: (1) coating by surface oxidation, carbonizing, nitriding, or the like, and (2) formation of an organic polymer film. The formation of a coating film by surface oxidation or the like was taught by Japanese Patent Application Public Disclosure Nos. 130203/1982, 124046/1984, 218646/1984, 173734/1985, 272362/1986, and others. According to these inventions, mold release characteristics are improved by inactivating the surface through oxidation, sulfurization, carbonization, or nitriding by liquid- or vapor-phase treatment, or both mold releasability and durability are improved by increasing the hardness with a coat of another metal oxide (e.g., SnO$_2$, TiO$_2$, or ZrO$_2$) formed by sputtering, or with a surface oxidized by oxygen-plasma treatment.

However, coated films of oxides, such as metal oxides, and nitrides seldom attain adequate durability, because they tend to be locally cracked by repetitive subjection to forces at shots of injection molding. Coats of this character do not provide satisfactory mold releasability yet and cannot be said to be durable.

Forming an organic polymer film on the surface of the stamper and other mold parts was disclosed by Japanese Patent Application Publication No. 10763/1983 and Japanese Patent Application Public Disclosure Nos. 209834/1984, 218821/1984 and others.

These processes involve the polymerization on the stamper surface of a fluorine compound, aliphatic halogen compound, aromatic halogen compound or the like converted to a plasma or activated by glow discharge, sputtering, or other treatment. Of those stampers, one coated with a fluorine polymer film exhibits outstanding mold release characteristics and is superior to metal compound-coated stampers.

On the other hand, the fluorine polymer film is not fully adhesive to the substrate, or the stamper surface of nickel or the like, and it can come off the stamper surface owing to localized variation of applicable forces and also to thermal stresses with repeated shots for injection molding of resin disks. Because of this drawback, the film is not relied upon for the extension of stamper life.

It is an object of the present invention to provide a wear-resistant, long-life mold.

Another object of the invention is to provide a mold with reduced frictional resistance.

Still another object of the invention is to provide a stamper and other mold parts which exhibit good mold release characteristics with respect to the resin being molded and hence good durability.

SUMMARY OF THE INVENTION

This invention provides a mold, including a stamper, characterized in that the portions of the mold that require wear resistance, corrosion resistance, and/or low frictional properties are coated with a film of diamond-like substance, a fluorine polymer film, or fluoride film. The portions to be coated are, for example, the inner surface of the cavity, the stamper-supporting surface, the side of the stamper secured to the mold, the gate cut surface, and/or the air vent surface.

The invention also provides a method of producing a mold by forming a diamond-like film on the above-mentioned surfaces. More particularly, the invention provides a method of producing a mold for the manufacture of disks or the like, characterized by the steps of placing a mold in position within a vacuum film-forming chamber, introducing a hydrocarbon gas into the chamber, ionizing the gas, and allowing the ions to evaporate and deposit on the necessary portions of the mold to form a diamond-like film thereon.

In this aspect of the invention, the portions of the mold normally subject to friction, wear, and/or corrosion are reinforced on the surface to achieve substantial improvements in wear resistance, corrosion resistance, and/or low frictional properties. Consequently, the stamper supported by the cavity surface of the mold, and the gate cut and air vent portions all have a markedly extended service life.

The invention also provides a process for the surface treatment of a record-molding stamper characterized in that, when a low-molecular-weight fluorine compound is converted to a plasma and a fluorine polymer film is formed on the stamper, a bias voltage is applied to the plasma.

In this way a mold with good mold release characteristics and, especially in the case of a stamper, good adhesion to the cavity surface, and excellent durability can be provided.

The invention further provides a process for the surface treatment of a mold of nickel or the like characterized in that a low-molecular-weight fluorine compound, such as $CF_4$, $SiF_4$, HF, or $F_2$, is converted to a plasma, and the plasma is caused to act on the mold surface to fluorinate said surface.

Thus, fluorination of the mold surface, such as of the stamper, makes it possible to provide a mold with good mold release characteristics and high durability.

DETAILED DESCRIPTION OF THE INVENTION

The mold according to this invention may be coated with a film in any manner provided that a uniform film of a diamond-like substance is formed on the desired surface portions of the mold cavity, the back side of the stamper (to be secured to the cavity surface), the gate cut portion, and/or the air vent portion. At the present time, however, there is practically no process available whereby a diamond or diamond-like film of sufficiently high crystallinity can be formed at a speed of commercial significance over an adequately large surface area. For this reason it is recommended to use the process now to be described.

(1) FORMATION OF A DIAMOND-LIKE FILM

Figure 2:
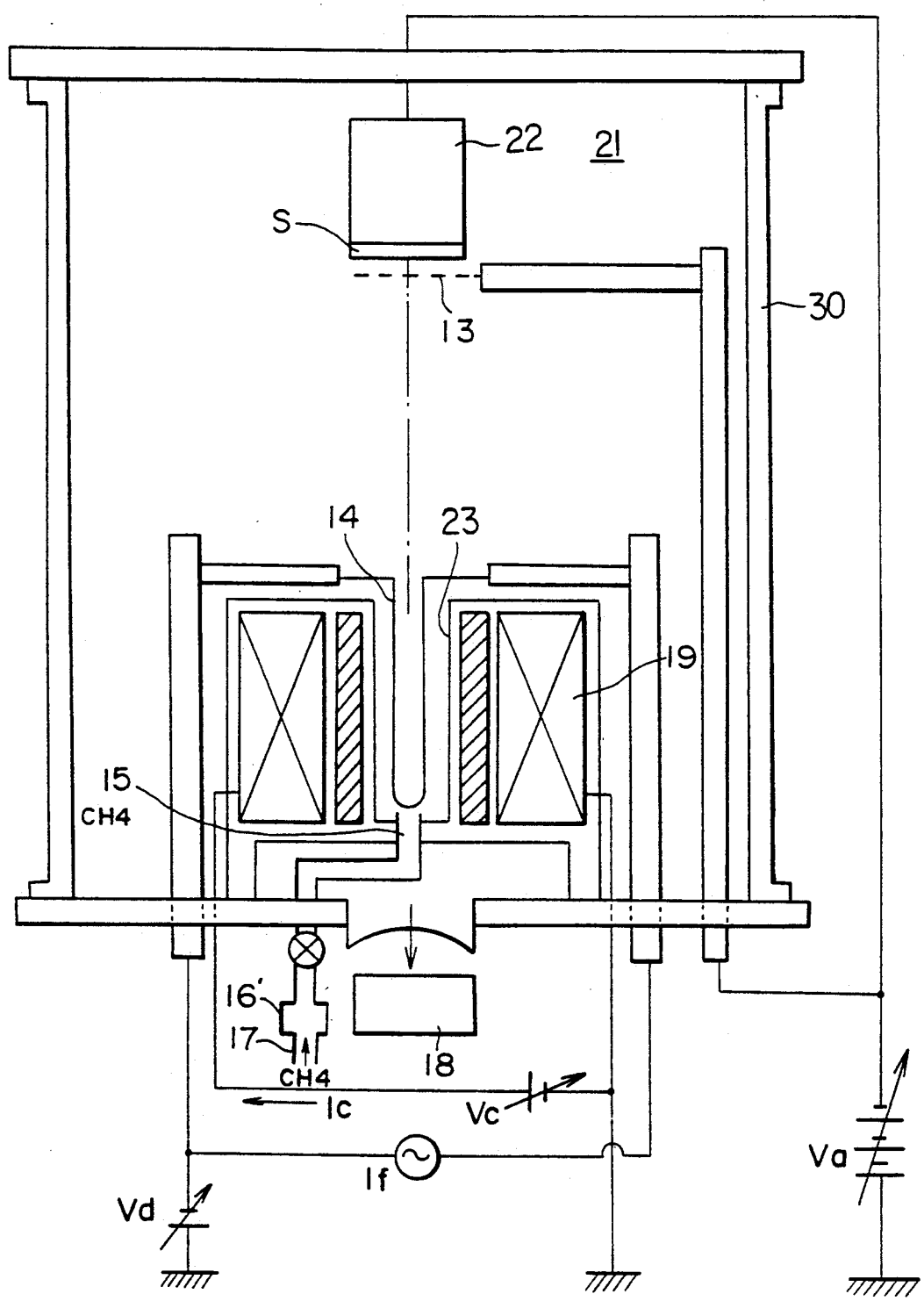
FIGS. 2 and 3 are sectional views of an apparatus for practicing the method of the invention.

In FIG. 2 is illustrated a preferred embodiment of a film-forming apparatus for forming a diamond-like film on the inner surface of a mold cavity, stamper-supporting surface 8, back side of a stamper, surface of a gate cut portion 10, the corresponding surface portion of a fixed mold half 5, and/or the surface of an air vent portion of the mold half 5, the surface of an air vent of an outer ring member 4, and the like. The apparatus may be of either a straight ion advance type or an ion deflection type described in Japanese Utility Model Application Publication No. 174507/1984 or any other desired type. For the film-forming conditions not specified herein, refer to the above publication.

Ionization evaporation, which forms the technical basis of the present invention, is disclosed in the publications of Japanese Patent Application Public Disclosure Nos. 174507/1983, 174508/1984 and elsewhere. In the working example of the invention, therefore, the procedure and apparatus based on the equipment described in those prior publications were used. Any other ionization evaporation concept may be adopted instead provided that it permits the ionization and acceleration of a hydrocarbon feed gas or a feed gas capable of producing a hydrocarbon on decomposition or reaction. For example, the processes that depend upon glow discharge, microwave, DC discharge, thermal decomposition, shock wave, or other means for the ionization of the hydrocarbon are also acceptable.

In practicing the invention, the process and apparatus described in the cited patent publications may be directly adopted. If required, ionized ions may be deviated by a magnetic field to obtain a harder film. Where the apparatus is used, thermionic emission by the hot filament decomposes the hydrocarbon feed gas or a feed gas capable of producing a hydrocarbon on decomposition or reaction, affording a gas which contains numerous ionic species, neutral molecules left undecomposed, atoms, radicals, and the like. For instance, in the case of commonly used methane feed gas, the ions that result from the thermionic emission by the hot filament are mostly $CH_4^+$ and $CH_3^+$, the remainder consisting of small percentages of $CH_2^+$, $CH^+$, $C^+$, and $H_2^+$. In addition, the gas contains various forms of nonionized reaction species, i.e., radicals, anions, carbides, unreacted matter, and the like. Collision of all these particles with the substrate results in decomposition of the ions, leaving only carbon behind, and the latter grows into a desired diamond structure. This film-forming process yields a diamond-like film with a high degree of surface smoothness.

It is also possible to use a means for plasma excitation of a hydrocarbon feed gas or a feed gas capable of producing a hydrocarbon on decomposition or reaction, before its introduction into a film-forming vessel (Japanese Patent Application No. 59377/1988). The plasma excitation is carried out by admitting the hydrocarbon gas into a plasma-exciting chamber and applying a predetermined amount of energy to the gas. As for the means for plasma excitation, any desired one known in the art, e.g., RF power or microwave, may be utilized. The plasma gas is formed not only from methane gas but also from any of other low-molecular-weight hydrocarbons or from a mixture of any such hydrocarbon and oxygen, nitrogen, argon, neon, helium or the like.

The prior plasma excitation of the hydrocarbon material facilitates the ionization and markedly enhances the film-forming efficiency.

In the practice of the invention it is desirable to use a diamond-like film in the thickness range of 300 to 20,000 Å. If the film is too thin the reinforcing effect for which the invention is intended is not achieved. If too thick, the diamond-like film is easy to come off the stamper and other mold part surface. It is also advisable that a diamond-like film with a Vickers hardness of 5,000 to 10,000 $kg/mm^2$ be used. If the hardness is insufficient, the intended reinforcing effect is not attained and hence inadequate durability. These requirements are readily met by the adoption of a process and an apparatus which are described below.

Referring now to FIG. 2, the numeral 30 designates a vacuum vessel and 21 a chamber connected to an evacuation system 18 so that it can be evacuated to a high vacuum of about $10^{-6}$ torr. A substrate holder 22 holds a substrate S, toward which a grid 13 for a voltage Va accelerates the flow of ions. A filament 14 is heated by an AC source If for thermionic emission and is kept at a negative potential Vd. The numeral 15 indicates an inlet for feeding hydrocarbon gas as a starting/material. An anode 16 is arranged around the filament 14 to provide a voltage Vd between itself and the filament. A solenoid 19 is so disposed as to surround the filament 14, anode 16, and feed inlet 15 to produce a magnetic field for the containment of ionized gas. It is thus possible to modify the quality of the resulting film through the adjustments of the voltages Vd and Va and of the current on the solenoid. Where the substrate for film formation is not located on the straight line as shown, the ion stream may be accordingly deflected by a suitable means. A plasma exciter is provided on a line for feeding hydrocarbon feed gas.

The process for film forming by the use of the apparatus illustrated in FIG. 2 will now be explained in detail. First, the chamber 21 is evacuated up to a high vacuum of $10^{-6}$ torr, and while methane gas is being led into the vessel at a predetermined flow rate through the manipulation of a valve, the evacuation system 18 is controlled to establish a desired gas pressure, e.g., $10^{-1}$ torr. Meanwhile, the filament 14 is heated by the passage of an alternating current If, and a differential voltage Vd is applied between the filament 14 and the gas feed inlet 15 to cause thermionic emission by the hot filament. Methane gas or other similar hydrocarbon gas admitted to the feed pipe 17 first produces a plasma in the plasma exciter 23. The feed gas then enters the chamber 21 at the inlet 15 and is thermally decomposed while colliding with hot electrons from the filament to form positive ions and electrons. The latter in turn collides with other thermally decomposed particles. Repetition of this phenomenon converts the methane gas into positive ions of the thermally decomposed material.

The positive ions are directed toward the substrate S, acclerated by a negative potential Va applied to the grid 13. For the potential, current, temperature, and other conditions for the individual parts involved, refer to the above-mentioned patent publications and other known pieces of the literature.

As the plasma source, it is possible to use, besides methane gas, any of other low-molecular-weight hydrocarbon feed gases or feed gases capable of giving hydrocarbons upon decomposition or reaction, or a mixture of one of such feed gases and oxygen, nitrogen, argon, neon, helium or the like.

(2) FORMATION OF A FLUORINE RESIN FILM

The requirements essential for the surface coating of a stamper and other mold parts are, as noted already, good mold release characteristics with respect to the resin being molded, high adhesion to the supporting surface, and, for the stamper, a film structure thin and dense enough to permit precise reproduction as a reverse impression of the nickel-surface irregularities as fine as 0.1 $\mu m$ onto the medium being molded as records of information.

While the mold releasability requirement is satisfied by a fluorine polymer film formed by a conventional polymerization process, the surface treatment by plasma polymerization in accordance with the present invention, which involves application of a bias voltage, substantially improves the film adhesion to the nickel base. The fluorine polymer film satisfactorily formed by plasma polymerization to be thin enough for the reproduction of the fine pattern of the nickel base surface ranges in thickness from about 30 to about 200 Å, preferably from about 30 to about 100 Å.

The fluorine compound to be used for the formation of a plasma polymer film is a low-molecular-weight one chosen from among tetrafluoroethylene, trifluorochloroethylene, allyltrifluoroacetylene, perfluorobutyl methacrylate, hexanefluoropropylene, octafluorocyclobutane, trifluoromethane, and octafluoropropane. Of these compounds, tetrafluoroethylene, hexafluoropropylene, octafluorocyclobutane, trifluoromethane, and the like are preferably employed.

Figure 3:
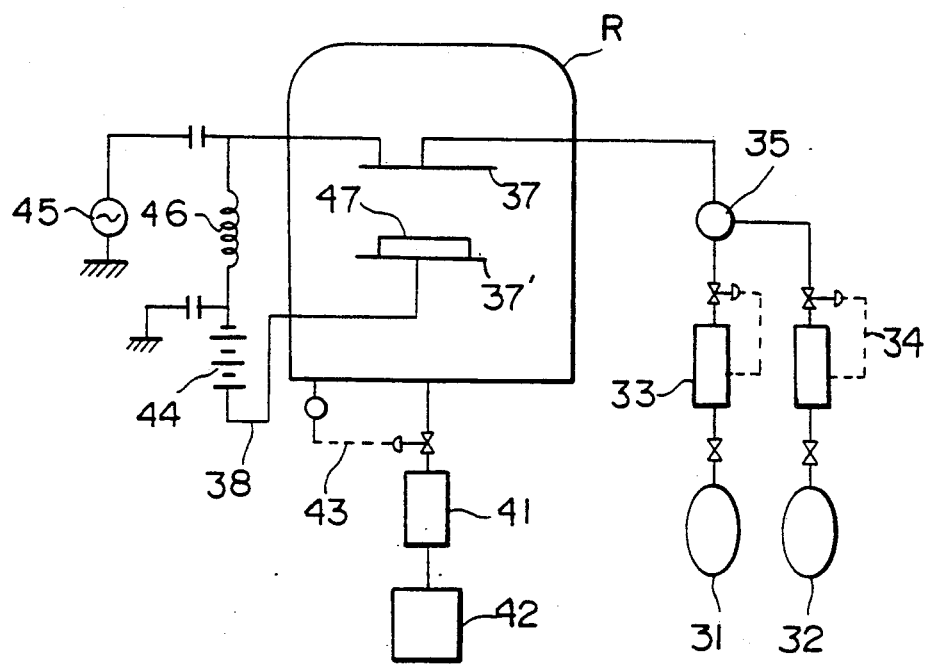

Next, for the formation of a plasma polymer film embodying the invention, an exemplary plasma polymerization apparatus is shown in FIG. 3. While this apparatus depends on high-frequency discharge, any other desired film-forming means such as microwave discharge or glow discharge may be used instead.

The process of plasma polymerization consists of mixing the discharge plasma of a carrier gas, such as Ar, He, $H_2$, or $N_2$, with a monomer gas of a fluorine compound, and bringing the mixture into contact with the surface of a stamper to form a plasma polymer film thereon.

Referring to FIG. 3, a monomer gas and a carrier gas supplied from a monomer gas source 31 and a carrier gas source 32 via mass flow controllers 33 and 34, respectively, are mixed by a mixer 35, and the mixture is fed into a polymerization reactor. As noted above the monomer gas is selected from the fluorine compounds such as tetrafluoroethylene, and the carrier gas from Ar, He, and the like. The monomer gas is fed at the rate of 1 to 100 ml/min and the carrier gas at the rate of 0 to 100 ml/min. Inside the polymerization reactor R, there are disposed a pair of electrodes 37,37' in spaced relation, with a stamper 47 secured to the surface of the electrode 37'. A high-frequency power source 45 is connected to the electrode 37. Across the electrodes 37,37', a DC bias source 44 is connected via 38,46 so as to bias the electrode 37' positively and the electrode 37 negatively. Further, the reactor R is equipped with an evacuation system to evacuate the vessel. The system comprises a liquid nitrogen trap 41, an oil pump 42, and a vacuum controller 43. It maintains a vacuum of 0.01 to 10 torr inside the reactor. Desirably, the bias voltage ranges from 50 to 5,000 V and the frequency from the high-frequency source, from several to several ten MHz.

As an alternative, the high-frequency discharge may be replaced by microwave discharge, as disclosed in Japanese Patent Application Public Disclosure No. 222114/1983 (Nakayama et al.).

(3) FORMATION OF A SURFACE LAYER BY FLUORINATION

While the requirement of mold releasability is met by a fluorine polymer film formed by an ordinary polymerization process, the surface treatment with fluorine or a fluoride in the form of a plasma in accordance with the present invention fluorinates the nickel base, precluding the possibility of the film falling off the base. This effect can be enhanced by the application of a bias voltage to the plasma. The surface fluorination does not adversely affect the reproduction as a reverse impression of the delicately detailed pattern of the nickel base surface.

The fluorine or low-molecular-weight fluorine compound which may be used for the surface fluorination in conformity with the invention is chosen from among $CF_4$, $SiF_4$, $HF$, $F_2$, and the like.

The apparatus for performing the plasma treatment for fluorination according to the invention is similar to the one illustrated in FIG. 3, with the exception that dissimilar feed gas and conditions are used.

The process of plasma treatment comprises mixing a discharge plasma of carrier gas, e.g., Ar, He, $H_2$, or $N_2$, with a gas of low-molecular-weight fluorine compound, and bringing the mixture into contact with the surface of a stamper or other mold part so as to fluorinate the surface.

Desirably, a bias voltage is applied to the plasma so as to accelerate the fluorine ions toward the stamper surface, promote the reaction with the surface, and thereby effect rapid surface fluorination.

APPARATUS FOR TREATMENT

Referring again to FIG. 3, fluorine or a fluorine compound gas and a carrier gas supplied from a fluorine or fluorine compound gas source 31 and a carrier gas source 32 via mass flow controllers 33 and 34, respectively, are mixed by a mixer 35, and the mixture is fed into a vessel for plasma treatment. The fluorine or fluorine compound gas is selected from the above-mentioned compounds and the carrier gas from Ar, He, and the like. The fluorine or fluorine compound gas is fed at the rate of 1 to 100 ml/min and the carrier gas at the rate of 0 to 100 ml/min. Inside the plasma treatment vessel R, there are disposed a pair of electrodes 37, 37' in spaced relation, with a stamper 47 secured to the surface of the electrode 37'. A high-frequency power source 45 is connected to the electrode 37. Across the electrodes 37, 37', a DC bias source 44 is connected so as to bias the electrode 37' positively and the electrode 37 negatively. Further, the vessel R is equipped with an evacuation system to evacuate the vessel, comprising a liquid nitrogen trap 41, an oil pump 42, and a vacuum controller 43. It maintains a vacuum of 0.01 to 10 torr inside the vessel. Desirably, the bias voltage ranges from 50 to 5,000 V and the frequency from the high-frequency source, from several to several ten MHz.

FORMATION OF DIAMOND-LIKE FILMS

EXAMPLE 1

Figure 1:
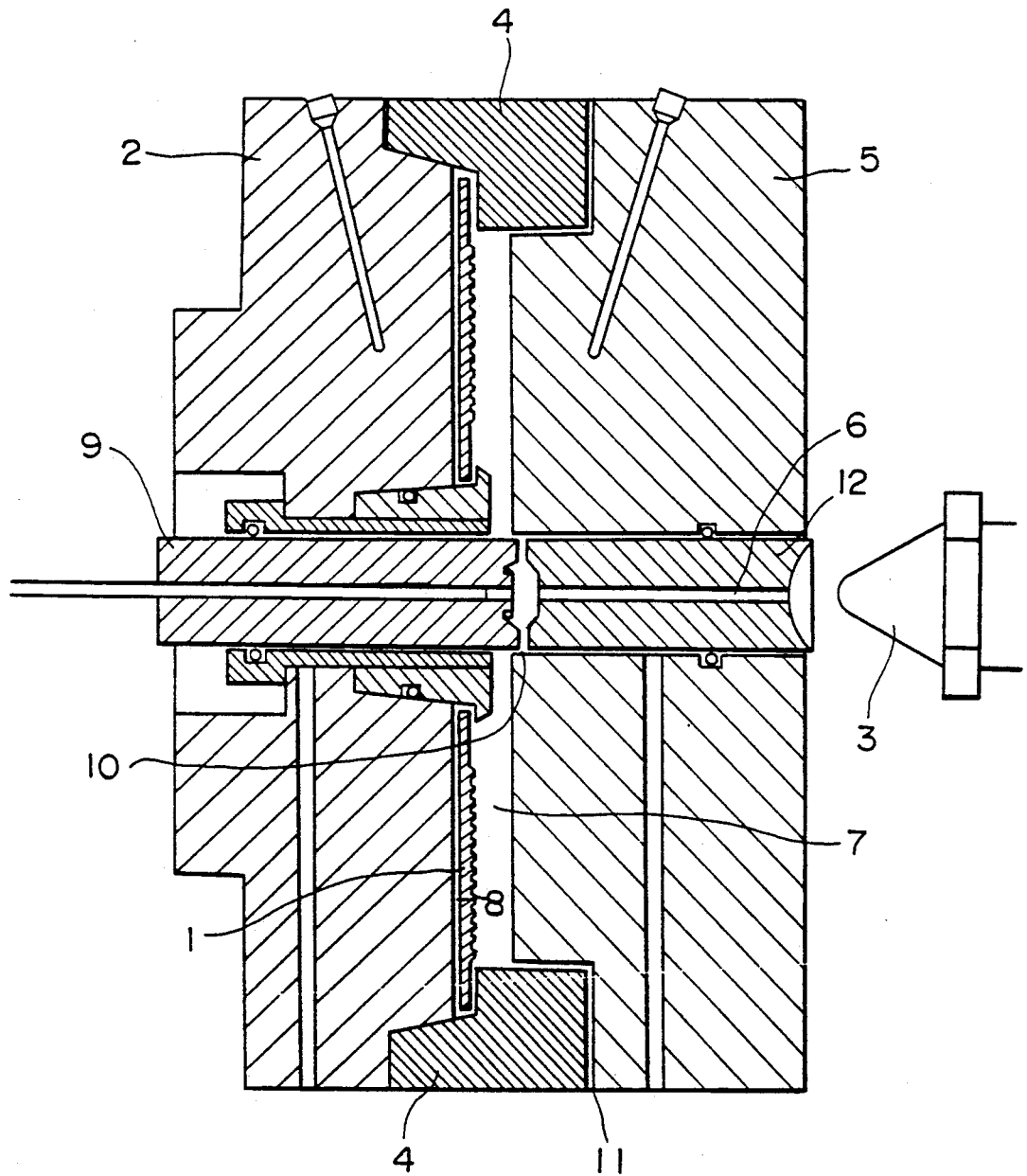
FIG. 1 is a sectional view of a typical mold to which the present invention is applicable.

A nickel-plated, highly polished movable mold was held in place within a vacuum vessel 30. With the stamper-supporting surface 8 of the mold facing the cavity as shown in FIG. 1 as a substrate S, argon gas was introduced into the vacuum vessel 30 in FIG. 2. In a vacuum of $10^{-2}$ torr, an arc discharge was caused to bombard the substrate surface. Next, the argon gas was driven off from the vessel and instead methane gas was introduced up to a gas pressure of $10^{-1}$ torr. The flux density at the solenoid 19 was 400 gauss, the substrate voltage 400 V, and the substrate temperature 200° C. A current of 25 A was passed through the filament 14. A film of 3 μm thickness was formed.

The mold thus obtained was set in an injection molding apparatus for producing laser disks, as shown in FIG. 1, and injection molding operation was repeated at a pressure of 340 kg/cm$^2$.

By way of comparison, similar injection molding operation was carried on using a mold not coated with a diamond-like film. Also, a conventionally TiN-coated mold was experimented likewise.

Table 1 summarizes the results.

TABLE 1

| Surface treatment | Crazing or damage after 5,000 shots | Service life (No. of shot) |
|---|---|---|
| None | Deep | 2,600 |
| TiN-coated | Shallow | 4,000 |
| Diamond-like film-coated | None | 20,000 |

As can be seen from the table, the mold embodying the invention, which provided a diamond-like film on the stamper-supporting surface, could substantially extend the stamper life.

EXAMPLE 2

The same apparatus and conditions as described in Example 1 were used but the gate cut portion 10 of the mold shown in FIG. 1 was quenched and then coated with a diamond-like film.

For the comparison purpose, a mold with a gate cut as quenched (without a diamond-like coat) was made. Another mold whose gate cut portion was quenched and TiN-coated was also provided.

Injection molding operation was repeated using the three different molds. The results are shown in Table 2.

TABLE 2

| Mold with gate cut portion | No. of shots from cuttings-remaining limit till stamper replacement |
|---|---|
| Quenched | 200,000 |
| Quenched and TiN-coated | 300,000 |
| Quenched and diamond-like film coated | 800,000 |

The table indicates that the mold according to the present invention has by far the longer life than conventional molds.

EXAMPLE 3

Using the same apparatus and conditions as in Example 1, the air vent portion 11 of the mold shown in FIG. 1 was coated with a diamond-like film.

For comparison, a mold with an untreated gate cut portion was provided.

The two molds were used repeatedly in injection molding, and the results given in Table 3 were obtained.

TABLE 3

| Mold with gate cut portion | No. of shots until depth of corrosion exceeded 0.005 mm |
|---|---|
| Untreated | 150,000 |
| Diamond-like film-coated | 400,000 |

EXAMPLE 4

A mold for the injection molding of the halves of audio cassette housing was provided. The inner surface of the mold cavity was coated with a diamond-like film using the same apparatus and conditions as described in Example 1.

For the comparison purpose, molds with cavities untreated or only quenched were also provided.

The three molds were used repeatedly for injection molding, and the results shown in Table 4 were obtained.

TABLE 4

| Mold with cavity surface | Service life (No. of shot) |
|---|---|
| Green (without quenching) | 1,000,000 |
| Quenched | 3,000,000 |
| Diamond-film coated | 4,500,000 |

As will be appreciated from the foregoing, the present invention provides a wear-resistant, anticorrosive, and/or low-frictional resistance mold with extended service life.

The invention also will do much to reduce the molding cost.

EXAMPLE 5

A nickel-plated, highly polished stamper was held in place within a vacuum vessel 30. With the stamper-supporting surface 8 of the movable mold half facing the cavity shown in FIG. 1 as a substrate S, argon gas was introduced into the vacuum vessel 30 in FIG. 2. In a vacuum of $10^{-2}$ torr, an arc discharge was caused to bombard the substrate surface. Next, the argon gas was removed from the vessel and instead methane gas was introduced up to a gas pressure of $10^{-1}$ torr. The flux density at the solenoid 19 was 400 gauss, the substrate voltage 400 V, and the substrate temperature 200° C. A current of 25 A was passed through the filament 14. A film 3 μm in thickness was formed.

The stamper thus obtained was set in an injection molding apparatus for producing laser disks, as shown in FIG. 1, and injection molding operation was repeated at a pressure of 340 kg/cm$^2$.

For the comparison purpose, similar injection molding operation was carried on using a stamper not coated with a diamond-like film. Also, a conventionally TiN-coated stamper was used likewise in injection molding.

Table 5 shows the results.

TABLE 5

| Surface treatment | Crazing or damage after 5,000 shots | Service life (No. of shot) |
|---|---|---|
| None | Deep | 2,000 |
| TiN-coated | Shallow | 4,000 |
| Diamond-like film-coated | None | 20,000 |

As this table shows, the mold of the invention, which provided a diamond-like film on the stamper-supporting surface, could markedly extend the stamper life.

According to the present invention, as has been described above, a stamper with wear resistance and low frictional resistance is obtained and extension of stamper life realized.

The invention also makes possible a substantial reduction of the molding cost.

EXAMPLE 6

Fluorine polymer films were formed on Ni substrate surfaces from tetrafluoroethylene, hexafluoropropylene, or trifluoromethane as a monomer gas, using the apparatus shown in FIG. 3. The film-forming conditions were as follows:

| Monomer gas | tetrafluoroethylene, etc. |
|---|---|
| Monomer gas flow rate | 10 ml/min |
| Carrier gas | argon |
| Carrier gas flow rate | 5 ml/min |
| Degree of vacuum | 0.05 torr |
| High-frequency source | 13.56 MHz, 200 W |
| Bias voltage | 200 V |

By way of comparison, films were made in the same way with the exception that the bias voltage was zero. The films thus formed exhibited good uniformity in thickness. They were tested for their mold release characteristics and adhesion properties.

For the evaluation of adhesion, stampers coated with a plasma polymer film each were used in making photo disk bases by the 2P processing method. It was presumed that poor adhesion of the plasma polymer film to the nickel stamper resulted in the separation of the film during the 2P processing, which in turn adversely affected the angle of contact (making it smaller).

TABLE 6

| Monomer | Bias volt. appld | Angle of contact after molding 500 bases (°) | Angle of contact before molding (°) | Ellipsometric measurement Film thick. (Å) | Refrac. index |
|---|---|---|---|---|---|
| Tetra- fluoro- ethylene | 200 | 118 | 118 | 53 | 1.82 |
|  | 0 | 65 | 105 | 45 | 1.51 |
| Hexa- fluoro- propylene | 200 | 114 | 116 | 70 | 1.79 |
|  | 0 | 63 | 104 | 50 | 1.48 |
| Tri- fluoro- methane | 200 | 108 | 113 | 43 | 1.81 |
|  | 0 | 61 | 100 | 35 | 1.52 |
| Untreated | — | 49 | 49 | — | — |

The table indicates that the refractive indexes of the plasma polymer films thus formed increased upon application of the bias voltage. This means that the density or denseness of the films increased accordingly. Application of the plus bias voltage to the stamper permitted effective incorporation of fluorine into the film, with consequent increases in the angle of contact and in the film-forming rate. These two effects combine with the bombardment of the stamper with fluorine ions to make the stamper more durable. This is reflected in the difference in the results of separation tests between the stampers of the invention and the comparative stampers.

As will be appreciated from the above, the film formed by plasma polymerization with the application of a bias voltage is dense and adheres to the metal solidly enough to extend the life of the stamper.

EXAMPLE 7

Using the apparatus shown in FIG. 3, fluorine films were formed on Ni substrate surfaces from fluorine or a fluorine compound gas of HF, $CF_4$, or $SiF_4$. The treating conditions used were as follows:

| | |
|---|---|
| Fluorine or fluorine compound gas flow rate | 30 ml/min |
| Carrier gas | argon |
| Carrier gas flow rate | 15 ml/min |
| Degree of vacuum | 0.2 torr |
| High-frequency source | 13.56 MHz, 200 W |
| Bias voltage | 0 V/cm, 200 V/cm |

Mold releasing and adhesion properties were determined. The mold releasability was evaluated in terms of the angle of contact, and the degree of fluorination in terms of the chemical shift in electron spectroscopy for chemical analysis (ESCA). Untreated specimens were likewise tested for the purposes of comparison. The results are given in the following table.

TABLE 7

| Treating gas | Bias volt. appld | Angle of contact after molding 500 bases (°) | Angle of contact before molding (°) | ESCA chemical shift with F atoms |
|---|---|---|---|---|
| HF | 200 | 96 | 98 | 0.3 |
|  | 0 | 54 | 65 | 0.1 |
| $CF_4$ | 200 | 99 | 102 | 0.3 |
|  | 0 | 56 | 69 | 0.1 |
| $SiF_4$ | 200 | 108 | 108 | 0.3 |
|  | 0 | 60 | 72 | 0.1 |
| $O_2$ | 0 | 42 | 16 | — |
| $N_2$ | 0 | 50 | 52 | — |
| Untreated | — | 49 | 49 | — |

It will be seen from the above table that the angle of contact (hence the separation property) of the fluorinated stamper surface is greater than those of oxidized or nitrided ones, indicating that the fluorination imparts excellent separability or mold releasability. When combined with the application of a bias voltage in conformity with the present invention, as is evident from the chemical shift, the fluorination of the stamper surface is promoted and the mold releasability is outstandingly improved. Unlike the conventional stampers on which an organic fluorine film is formed, the stamper according to the invention is fluorinated itself and it presents no such prior art problem as the exfoliation of the organic fluorine film.

What is claimed is:

1. A mold defining a cavity having an inner surface, characterized in that at least a portion of said inner surface is coated with a film comprised of a material selected from the group consisting of a diamond-like carbon having a Vickers hardness of 5,000–10,000 kg/mm$^2$ and a fluoride of a material forming said portion of said inner surface.

2. A mold according to claim 1 wherein said portion of said inner surface of said cavity is adapted to support a stamper, and said portion is coated with a film of said diamond-like carbon.

3. A mold according to claim 1 wherein said mold further comprises a gate cut member having a gate cut portion, and said gate cut portion of said gate cut member forms said portion of the inner surface of said mold coated with a film of said diamond-like carbon.

4. A mold according to claim 1 wherein said mold further defines an air vent portion and said air vent portion forms said portion of the inner surface of said mold coated with a film of said diamond-like carbon.

5. A mold according to claim 1 further comprising a stamper, wherein one portion of the inner surface of said cavity supports said stamper and one surface of said stamper facing the inner surface and said one portion of said inner surface are coated with a film of said diamond-like carbon.

6. A mold according to claim 5 wherein said film of said diamond-like carbon has a thickness of from 300 to 20,000 Å.

* * * * *